US010551453B2

(12) United States Patent
Sakakura

(10) Patent No.: US 10,551,453 B2
(45) Date of Patent: Feb. 4, 2020

(54) GRADIENT COIL AND MAGNETIC RESONANCE IMAGING DEVICE

(71) Applicant: TOSHIBA MEDICAL SYSTEMS CORPORATION, Otawara-shi (JP)

(72) Inventor: Yoshitomo Sakakura, Tochigi (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 405 days.

(21) Appl. No.: 14/976,274

(22) Filed: Dec. 21, 2015

(65) Prior Publication Data

US 2016/0109542 A1    Apr. 21, 2016

Related U.S. Application Data

(63) Continuation of application No. PCT/JP2014/064783, filed on Jun. 3, 2014.

(30) Foreign Application Priority Data

Jun. 28, 2013   (JP) .................................. 2013-136969

(51) Int. Cl.
*G01R 33/385*      (2006.01)

(52) U.S. Cl.
CPC .................................. *G01R 33/385* (2013.01)

(58) Field of Classification Search
None
See application file for complete search history.

(56) References Cited

U.S. PATENT DOCUMENTS

| 5,278,504 | A  | * | 1/1994  | Patrick  | G01R 33/385 |
|           |    |   |         |          | 324/318     |
| 5,311,135 | A  | * | 5/1994  | Vavrek   | G01R 33/385 |
|           |    |   |         |          | 324/318     |
| 5,349,744 | A  | * | 9/1994  | Takahashi | G01R 33/3858 |
|           |    |   |         |          | 29/602.1    |
| 6,311,389 | B1 | * | 11/2001 | Uosaki   | G01R 33/3858 |
|           |    |   |         |          | 29/605      |
| 6,584,045 | B1 | * | 6/2003  | Ishii    | G11B 11/10534 |
|           |    |   |         |          | 369/13.17   |
| 2006/0113996 | A1 | * | 6/2006 | Feenan  | G01R 33/385 |
|           |    |   |         |          | 324/318     |
| 2012/0176137 | A1 | * | 7/2012 | Terada  | G01R 33/385 |
|           |    |   |         |          | 324/322     |

FOREIGN PATENT DOCUMENTS

| JP | 08-332176   | 12/1996 |
| JP | 2006-116305 | 5/2006  |
| JP | 2009-050466 | 3/2009  |
| JP | 2010-088619 | 4/2010  |

OTHER PUBLICATIONS

Office Action dated Nov. 22, 2016 in JP 2013-136969.
International Search Report for PCT/JP2014/064783 dated Aug. 26, 2014, two pages.

* cited by examiner

*Primary Examiner* — Nasima Monsur
(74) *Attorney, Agent, or Firm* — Nixon & Vanderhye P.C.

(57) ABSTRACT

A gradient coil according to an embodiment includes a saddle coil conductor part that is formed of a conductive material to have a substantially cylindrical shape. The conductor part includes a first region on which a spiral shaped first pattern is formed and a second region on which a second pattern different from the spiral shaped first pattern is formed.

9 Claims, 7 Drawing Sheets

GRADIENT COIL AND MAGNETIC RESONANCE IMAGING DEVICE

CROSS-REFERENCE TO RELATED APPLICATIONS

This application is a continuation of PCT international application Ser. No. PCT/JP2014/064783 filed on Jun. 3, 2014 which designates the United States, incorporated herein by reference, and which claims the benefit of priority from Japanese Patent Application No. 2013-136969, filed on Jun. 28, 2013, the entire contents of which are incorporated herein by reference.

FIELD

Embodiments described herein relate generally to a gradient coil and a magnetic resonance imaging device.

BACKGROUND

Magnetic resonance imaging is an imaging method of magnetically exciting a nuclear spin of a subject placed in a static magnetic field with a radio frequency (RF) pulse of the Larmor frequency, and generating an image from data of a magnetic resonance signal generated due to the excitation.

Conventionally, a gradient coil of a magnetic resonance imaging device is produced by laminating a plurality of coils and cooling pipes, and the like, impregnating (injecting) resin, and hardening the resin. However, the resin contracts in hardening processing, which may cause cracks or detachment at parts where an amount of impregnated resin is large.

DETAILED DESCRIPTION

A gradient coil according to an embodiment includes a saddle coil conductor part that is formed of a conductive material to have a substantially cylindrical shape. The conductor part includes a first region on which a spiral shaped first pattern is formed and a second region on which a second pattern different from the spiral shaped first pattern is formed.

With reference to the drawings, the following describes a gradient coil and a magnetic resonance imaging device (hereinafter, appropriately referred to as a "magnetic resonance imaging (MRI) device") and a gradient coil according to embodiments. The embodiments are not limited to the following embodiments. Content described in each of the embodiments can be similarly applied to other embodiments in principle.

First Embodiment

Figure 1:
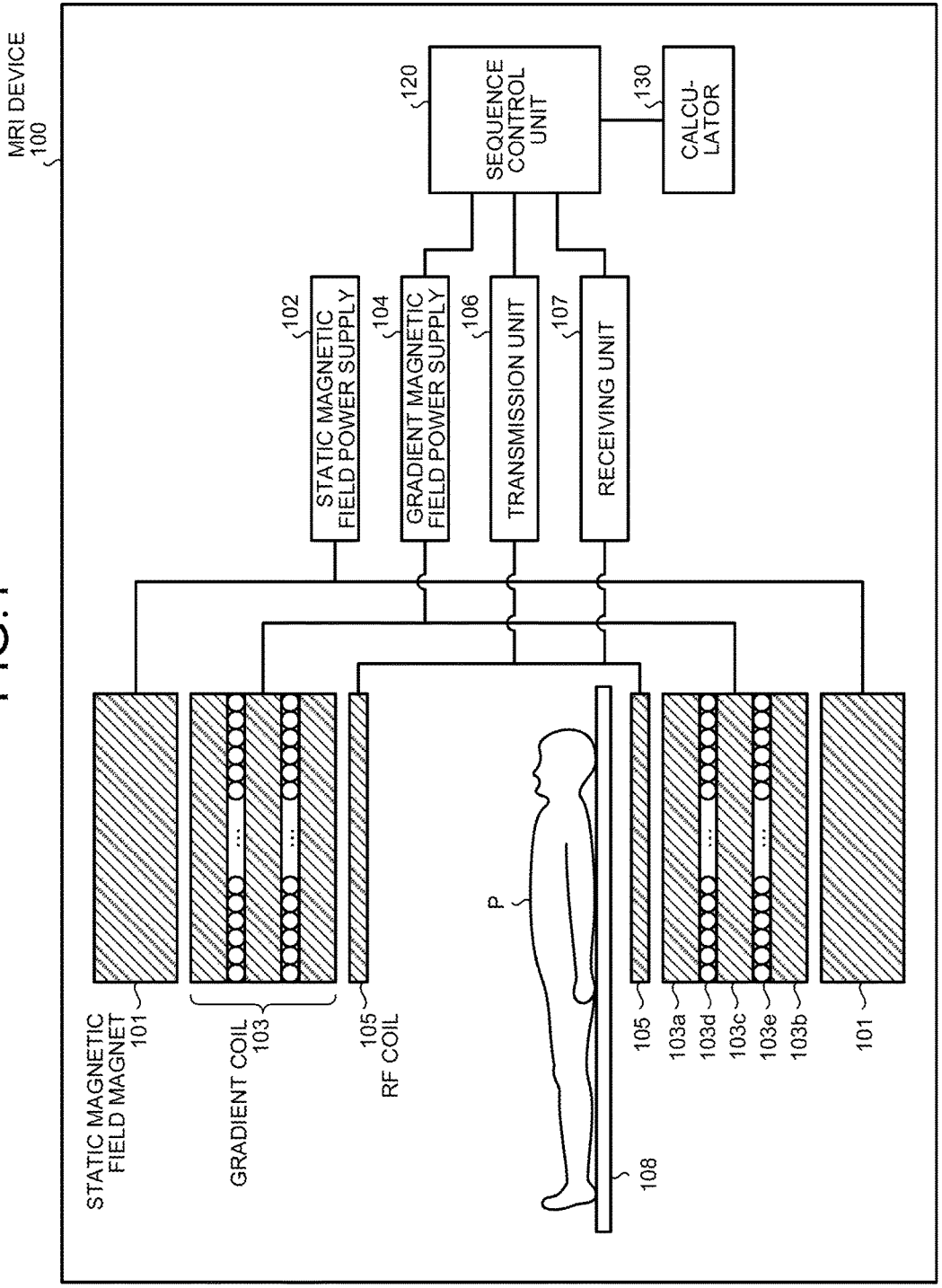
FIG. 1 is a functional block diagram illustrating a configuration of an MRI device according to a first embodiment.

FIG. 1 is a functional block diagram illustrating a configuration of an MRI device 100 according to a first embodiment. As illustrated in FIG. 1, the MRI device 100 includes a static magnetic field magnet 101, a static magnetic field power supply 102, a gradient coil 103, a gradient magnetic field power supply 104, an RF coil 105, a transmission unit 106, a receiving unit 107, a couch 108, a sequence control unit 120, and a calculator 130. The MRI device 100 does not include a subject P (for example, a human body). The configuration illustrated in FIG. 1 is merely an example. The components may be appropriately integrated or separated.

The static magnetic field magnet 101 is a magnet formed into a hollow cylindrical shape, and generates a static magnetic field in a space inside the cylindrical shape. The static magnetic field magnet 101 is, for example, a superconducting magnet, and is excited by receiving an electric current supplied from the static magnetic field power supply 102. The static magnetic field power supply 102 supplies the electric current to the static magnetic field magnet 101. The static magnetic field magnet 101 may also be a permanent magnet. In this case, the MRI device 100 does not necessarily include the static magnetic field power supply 102. The static magnetic field power supply 102 may be provided separately from the MRI device 100.

The gradient coil 103 is a coil that is arranged on the inner side of the static magnetic field magnet 101 and formed into a hollow cylindrical shape. The gradient coil 103 receives the electric current supplied from the gradient magnetic field power supply 104, and generates a gradient magnetic field. The gradient coil 103 will be described in detail later. The gradient magnetic field power supply 104 supplies the electric current to the gradient coil 103.

The RF coil 105 is arranged on the inner side of the gradient coil 103, and receives an RF pulse supplied from the transmission unit 106 to generate a high-frequency magnetic field. The RF coil 105 receives a magnetic resonance signal (hereinafter, appropriately referred to as a "magnetic resonance (MR) signal") emitted from the subject P due to influence of the high-frequency magnetic field, and outputs the received MR signal to the receiving unit 107.

Note that the RF coil 105 described above is merely an example. The RF coil 105 may be configured by combining one or more of a coil having a transmission function alone, a coil having a reception function alone, and a coil having a transmission and reception function. For example, the RF coil 105 is configured by combining a whole body (WB) coil having a transmission and reception function and a phased array (PA) coil having a reception function.

The transmission unit 106 supplies, to the RF coil 105, an RF pulse corresponding to the Larmor frequency determined due to a type of a target atom and magnetic field intensity. The receiving unit 107 detects the MR signal output from the RF coil 105, and generates MR data based on the detected MR signal. Specifically, the receiving unit 107 digitally converts the MR signal output from the RF coil 105 to generate the MR data. The receiving unit 107 transmits the generated MR data to the sequence control unit 120. The receiving unit 107 may also be provided on a base device side including the static magnetic field magnet 101, the gradient coil 103, and the like.

The couch 108 includes a couchtop on which the subject P is placed. For convenience of explanation, FIG. 1 illustrates the couchtop alone. Typically, the couch 108 is arranged so that a center axis of the cylindrical static magnetic field magnet 101 is in parallel with a longitudinal direction of the couch 108. The couchtop is movable in the longitudinal direction and a vertical direction, and inserted into the cylindrical space inside the RF coil 105 in a state where the subject P is placed thereon. The cylindrical space may be referred to as a "bore" and the like in some cases.

The sequence control unit 120 drives the gradient magnetic field power supply 104, the transmission unit 106, and the receiving unit 107 to image the subject P based on sequence information transmitted from the calculator 130. In this case, the sequence information defines a procedure of imaging. The sequence information defines intensity of the electric current supplied from the gradient magnetic field power supply 104 to the gradient coil 103 and timing for supplying the electric current, intensity of the RF pulse supplied from the transmission unit 106 to the RF coil 105 and timing for applying the RF pulse, timing when the receiving unit 107 detects the MR signal, and the like.

For example, the sequence control unit 120 is an integrated circuit such as an application specific integrated circuit (ASIC) and a field programmable gate array (FPGA), or an electronic circuit such as a central processing unit (CPU) and a micro processing unit (MPU).

The sequence control unit 120 drives the gradient magnetic field power supply 104, the transmission unit 106, and the receiving unit 107 to image the subject P, receives the MR data from the receiving unit 107, and transfers the received MR data to the calculator 130.

The calculator 130 controls the entire MRI device 100. The calculator 130 performs reconstruction processing such as a Fourier transformation on the MR data transferred from the sequence control unit 120 to generate an MR image and the like. For example, the calculator 130 includes a control unit, a storage unit, an input unit, and a display unit. The control unit is an integrated circuit such as an ASIC and an FPGA, or an electronic circuit such as a CPU and an MPU. The storage unit is a semiconductor memory element such as a random access memory (RAM) and a flash memory, a hard disk, an optical disc, or the like. The input unit is a pointing device such as a mouse and a trackball, a selection device such as a mode changeover switch, or an input device such as a keyboard. The display unit is a display device such as a liquid crystal display.

Figure 2:
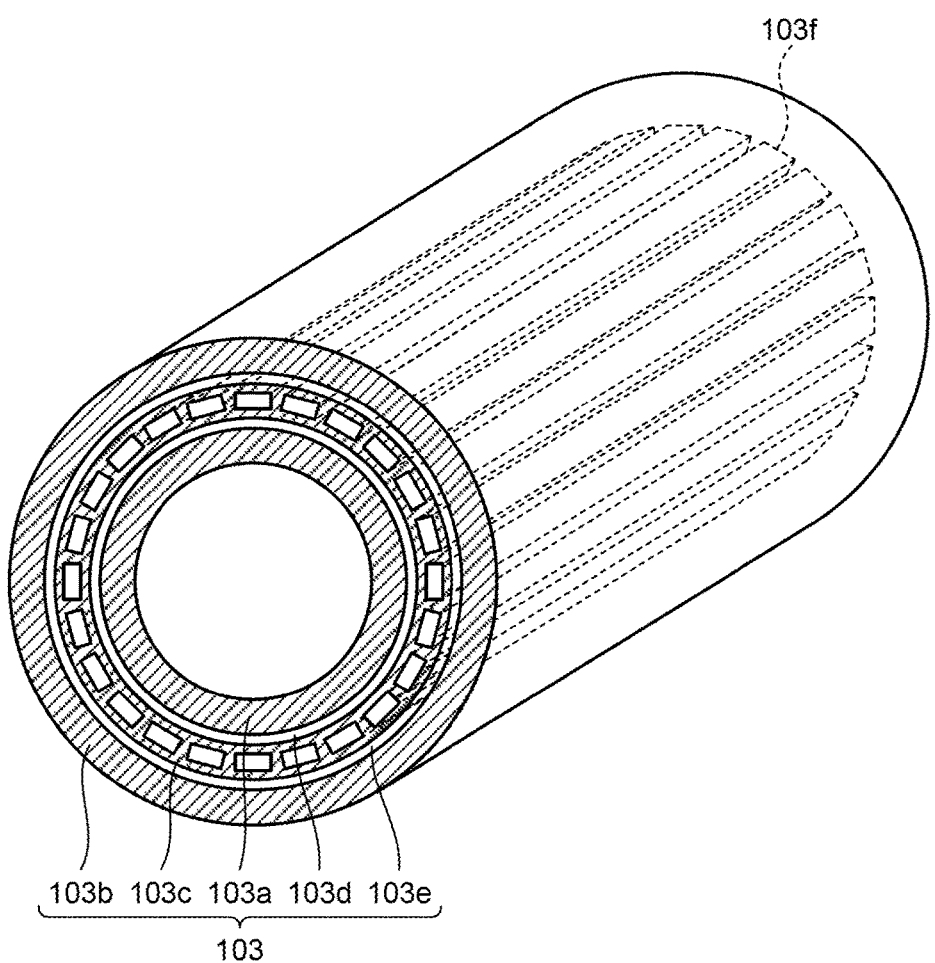
FIG. 2 is a perspective view illustrating a structure of a gradient coil according to the first embodiment.

FIG. 2 is a perspective view illustrating a structure of the gradient coil 103 according to the first embodiment. In the first embodiment, the gradient coil 103 is an actively shielded gradient coil (ASGC), and includes a main coil 103a that generates a gradient magnetic field and a shield coil 103b that generates a magnetic field for shielding to cancel a leakage magnetic field. As illustrated in FIG. 2, in the gradient coil 103, laminated are the main coil 103a, a cooling layer 103d in which a cooling pipe is laid, a shim layer 103c in which a shim tray is arranged, a cooling layer 103e in which the cooling pipe is laid, and the shield coil 103b in this order from the inner side near the inside of the cylindrical space.

In the shim layer 103c, a plurality of (for example, twenty-four) shim tray insertion guides 103f are formed. As illustrated in FIG. 2, the shim tray insertion guides 103f are typically holes passing through the entire length in the long axis direction of the gradient coil 103, and are formed at regular intervals in a circumferential direction. Each shim tray (not illustrated) inserted into the shim tray insertion guide 103f includes, for example, a plurality of (for example, fifteen) pockets in the longitudinal direction. A certain number of iron shims are accommodated in a certain pocket to correct nonuniformity of the static magnetic field.

In the cooling layer 103d and the cooling layer 103e, a cooling pipe is laid typically in a spiral manner along a cylindrical shape (illustration is omitted in FIG. 2). Although the illustration is omitted in FIG. 1, the MRI device 100 according to the first embodiment further includes a cooling device with a heat exchanger and a circulating pump, and the cooling device cools the gradient coil 103 by circulating a refrigerant such as water in the cooling pipe.

The main coil 103a is formed by laminating three coils corresponding to X, Y, and Z axes orthogonal to one another, that is, an X coil, a Y coil, and a Z coil. The X coil is a coil processed to be a saddle coil, and generates a gradient magnetic field along the X axis, that is, a horizontal axis of the cylinder of the gradient coil 103. Moreover, the Y coil is a coil processed to be a saddle coil, similarly to the X coil, and generates a gradient magnetic field along the Y axis, that is, a vertical axis of the cylinder of the gradient coil 103. Moreover, the Z coil is a coil processed to have a spiral shape, and generates a gradient magnetic field along the Z axis, that is, a major axis of the cylinder of the gradient coil 103. Each of the X coil, the Y coil, and the Z coil individually receives an electric current supplied from the gradient magnetic field power supply 104, and generates a gradient magnetic field in which magnetic field intensity is changed along each axis of X, Y, and Z. Note that the shield coil 103b is also formed by laminating three coils corresponding to the X, Y, and Z axes orthogonal to one another, that is, the X coil, the Y coil, and the Z coil. The laminating order of the coils can be changed appropriately.

The following will describe the X coil and the Y coil of the main coil 103a and the X coil and the Y coil of the shield coil 103b in the coils described above. Note that the following description may simply cite the X coil and the Y coil without distinguishing between the main coil 103a and the shield coil 103b.

In the first embodiment, each of the X coil and the Y coil is formed by winding four conductive plates around a bobbin of the gradient coil 103. Note that in the following, the X coil and the Y coil formed by combining conductive plates in such a manner may be represented as a "conductor part 10X" and a "conductor part 10Y", respectively, or a "conductor part" without distinguishing between them.

Figure 3:
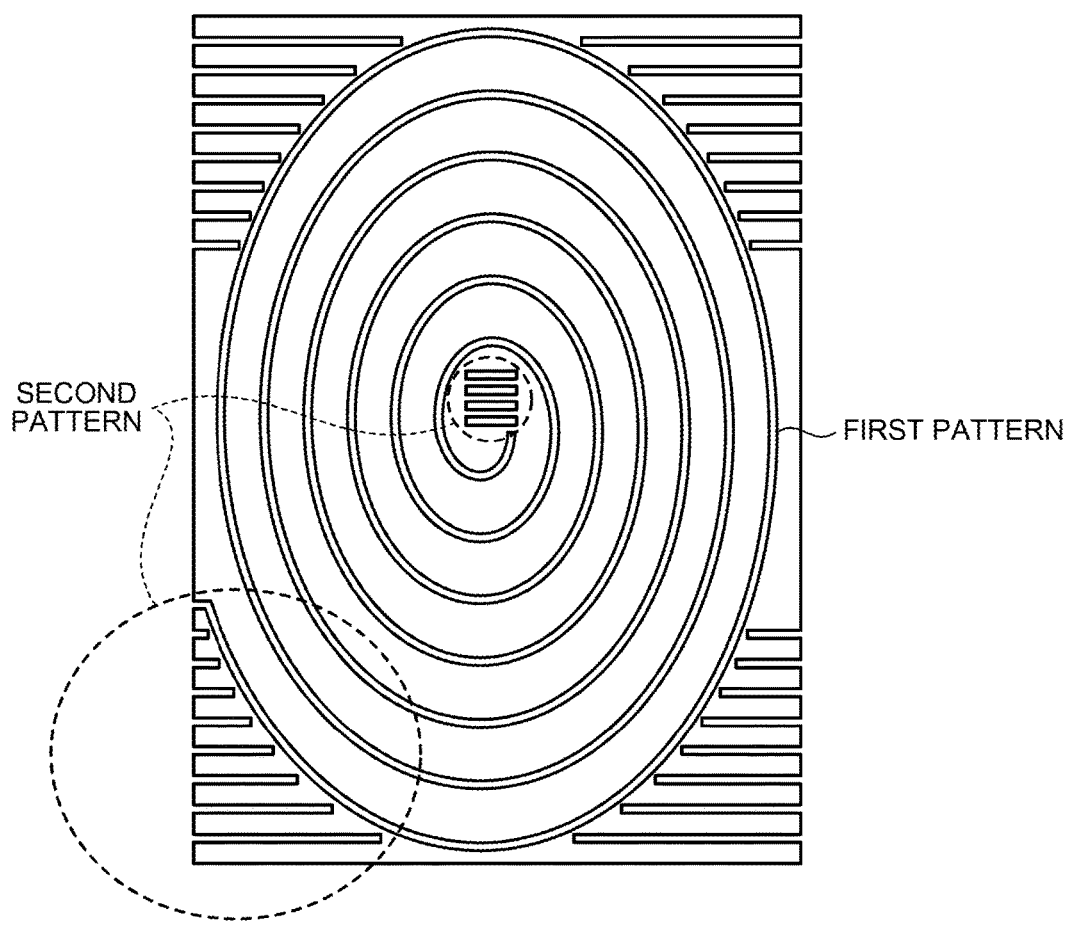
FIG. 3 is a diagram illustrating patterns formed on a conductor part according to the first embodiment.

FIG. 3 is a diagram illustrating one conductive plate of a conductor part according to the first embodiment, and a diagram illustrating patterns formed on the conductive plate. In the first embodiment, the X coil and the Y coil are formed by processing (e.g., cutting processing, etching processing, etc.) given patterns on the conductive plate (e.g., a copper plate, an aluminum plate, etc.). To be more specific, a spiral shaped first pattern and a second pattern different from the spiral shaped first pattern are formed on the conductive plate, as illustrated in FIG. 3. The second pattern is a pattern of stripes substantially parallel to the axis direction of the cylindrical shape of the gradient coil 103.

The spiral shaped first pattern is formed over the substantially entire surface of one conductive plate. The first pattern functions as a saddle coil. Meanwhile, as illustrated in FIG. 3, the striped second pattern is formed at the center part inside the spiral shaped first pattern or at the outer peripheral corner parts outside the spiral shaped first pattern. In other words, the striped second pattern is formed at vacant space where the first pattern is not formed on the conductive plate.

Figure 4:
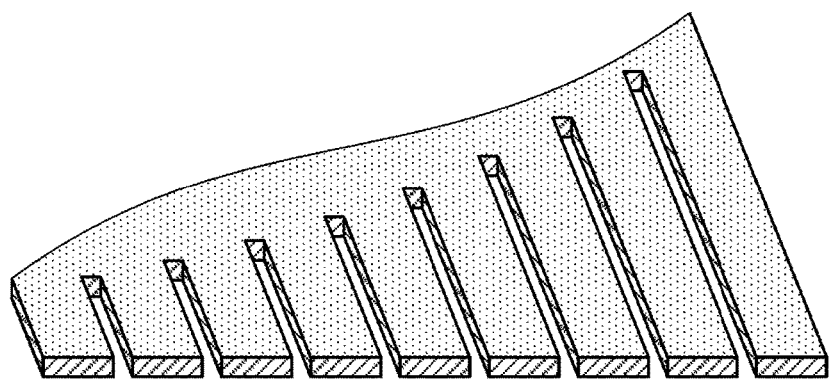
FIG. 4 is a diagram illustrating a second pattern formed on the conductor part according to the first embodiment.

FIG. 4 is a diagram illustrating a second pattern formed on the conductor part according to the first embodiment. FIG. 4 illustrates a perspective view of the second pattern formed on the outer peripheral corner part outside the spiral shaped first pattern, in the second pattern illustrated in FIG. 3. Note that in FIG. 4, a surface of the conductive plate is represented by dots and a section thereof is represented by oblique lines.

As illustrated in FIG. 4, in the first embodiment, the second pattern is formed of slits penetrating the conductive plate to the back side thereof and cut off on the plate in thin line forms. Although the illustration is omitted, the second pattern formed at the center part inside the spiral shaped first pattern, in the second pattern illustrated in FIG. 3, is also formed of slits penetrating the conductive plate to the back side thereof and cut off on the plate in thin line forms.

In this manner, in the first embodiment, a part where the first pattern is not formed on the conductive plate is also left without cutting off the conductive plate. Thus, it is possible to reduce an amount of impregnated resin, that is, an amount of resin injected to gaps and suppress cracks and detachment. It is also possible to suppress insulation deterioration.

Moreover, when a conductive plate is simply left, an eddy current may occur in such a part. However, in the first embodiment, the slits substantially parallel to the axis direction of the cylindrical shape, that is, a static magnetic field direction are formed on parts where the conductive plate is left, which prevents occurrence of an eddy current. Moreover, when the slits substantially parallel to the static magnetic field direction are formed, Lorentz force does not act on regions of the second pattern, which prevents the case in which the regions where the second pattern is formed (for example, outer peripheral corner parts) are moved during imaging. In addition, when the slits substantially parallel to the static magnetic field are formed, the regions where the second pattern is formed do not generate a magnetic field component (Bz component) used in imaging, which removes influence on imaging.

Furthermore, in the first embodiment, the first pattern and the second pattern are formed by mechanical processing on the conductive plate. Thus, for example, the man-hours for producing the gradient coil 103 can be reduced as compared with a method of manually filling vacant space so as to suppress cracks and detachment. It is also possible to stabilize the quality as compared with the method of manually filling vacant space.

Note that the embodiment is not limited to the first pattern and the second pattern illustrated in FIG. 3 and FIG. 4. The spiral shape, the number of patterns, a pattern width, and a width between patterns of the first pattern can be changed arbitrarily. FIG. 3 illustrates the example in which the second pattern is formed at the center part inside the spiral shaped first pattern and at the outer peripheral corner parts outside the spiral shaped first pattern. However, the embodiment is not limited thereto. For example, the second pattern may be appropriately formed, in the spiral shaped first pattern itself, at a part where the pattern width is large or a part where a width between patterns is large. In other words, the regions where the second pattern is formed are not limited to the example of FIG. 3, and may be appropriately provided at parts desired from the viewpoint of suppression of cracks and detachment.

Figure 5:
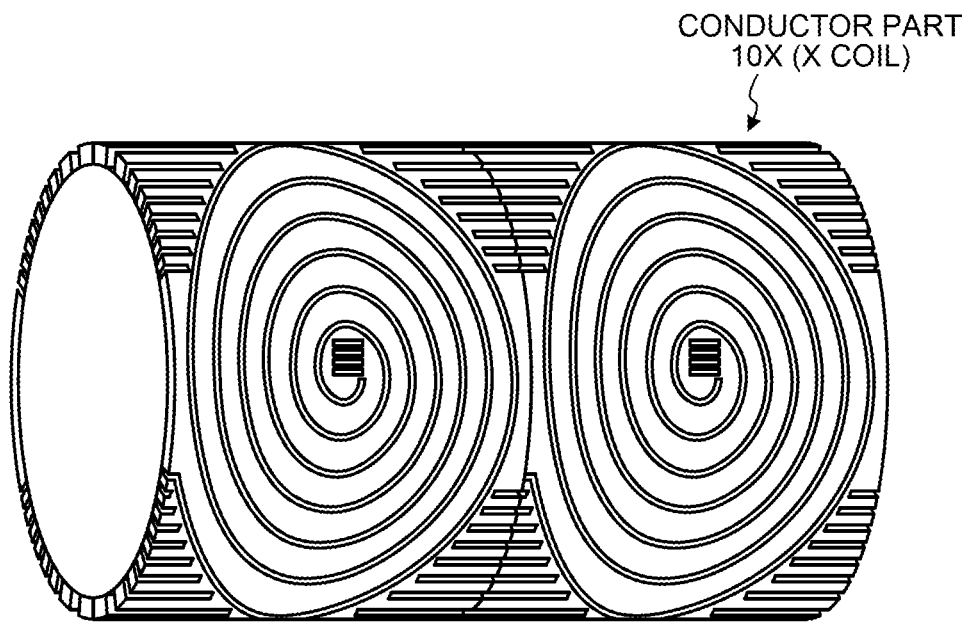
FIG. 5 is a diagram illustrating an X coil according to the first embodiment.
Figure 6:
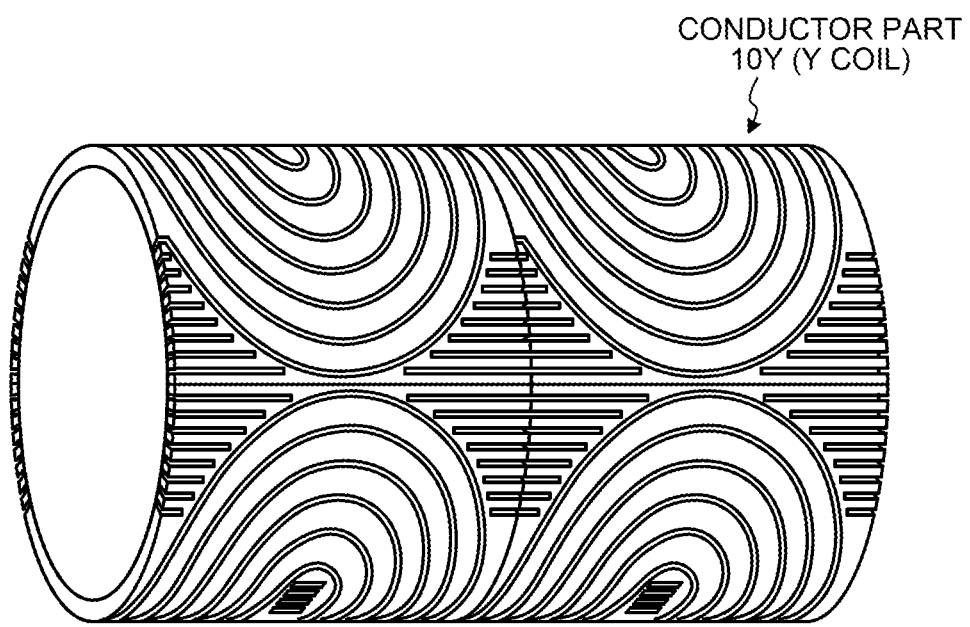
FIG. 6 is a diagram illustrating a Y coil according to the first embodiment.

FIG. 5 is a diagram illustrating the X coil according to the first embodiment, and FIG. 6 is a diagram illustrating the Y coil according to the first embodiment. As described above, in the first embodiment, each of the X coil and the Y coil is formed by winding four conductive plates around the bobbin of the gradient coil 103. To be more specific, as illustrated in FIG. 5 and FIG. 6, two conductive plates are arranged horizontally in the axis direction of the bobbin that is a core of the gradient coil 103, and each of the X coil and the Y coil is formed by winding two pairs of such two conductive plates around the bobbin in a circumferential direction. As is recognized by comparison between FIG. 5 and FIG. 6, the Y coil has the same configuration as that of the X coil rotated by 90° about an axis of the cylinder as a center.

Note that although the gradient coil 103 is formed by laminating a plurality of layers, as described above, FIG. 5 and FIG. 6 omit layers other than the X coil and layers other than the Y coil. Moreover, FIG. 5 and FIG. 6 illustrate the example in which the four conductive plates are spread without any gap. However, the embodiment is not limited thereto, and the arrangement relation of four plates can be changed appropriately.

As described above, in the first embodiment, the material is left also at parts where a spiral pattern is not formed in the saddle coil. Therefore, it is possible to reduce an amount of impregnated resin and suppress cracks and detachment. Moreover, in the first embodiment, the slits substantially parallel to the static magnetic field direction are formed on the left conductive material, which prevent occurrence of an eddy current, Lorentz force, and a magnetic field component having influence on imaging. Furthermore, the first embodiment employs the method by mechanical processing on a conductive plate, which contributes to reduction of manufacturing man-hours and stable quality of the gradient coil 103.

Second Embodiment

The second embodiment describes a method in which the X coil and the Y coil wound around the bobbin of the gradient coil 103 are further fixed by tape and the like.

Figure 7:
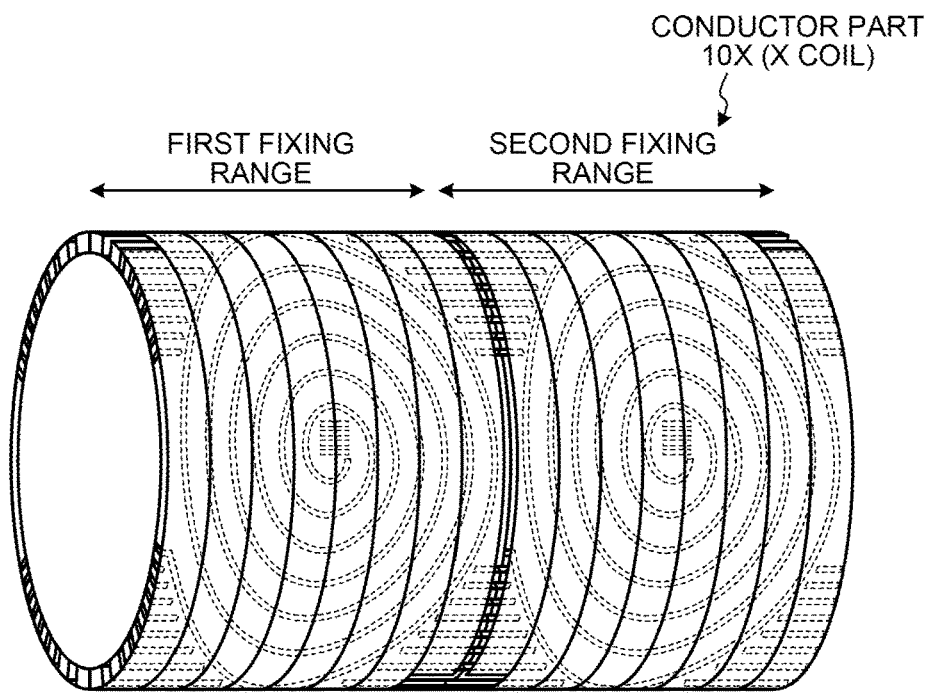
FIG. 7 is a diagram illustrating fixing of an X coil using tape according to a second embodiment.
Figure 8:
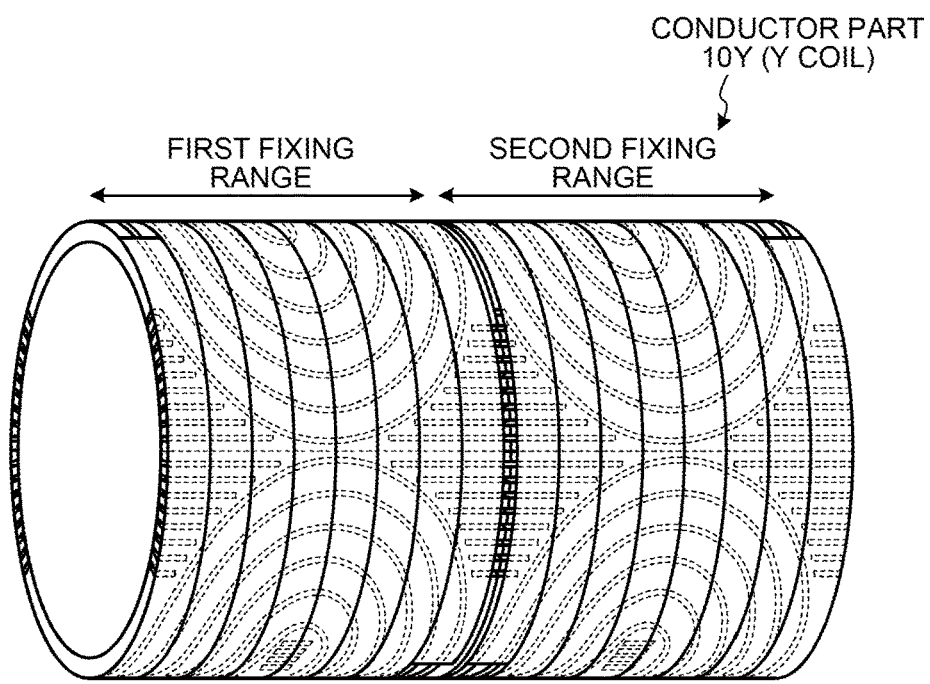
FIG. 8 is a diagram illustrating fixing of a Y coil using tape according to the second embodiment.

FIG. 7 is a diagram illustrating fixing of an X coil using tape according to the second embodiment, and FIG. 8 is a diagram illustrating fixing of a Y coil using tape according to the second embodiment. As illustrated in FIG. 7 and FIG. 8, in the second embodiment, the X coil and Y coil are fixed by winding tape around the coils. Note that in FIG. 7 and FIG. 8, the patterns of the X coil and the Y coil hidden under the tape wound around the coils are represented by dotted lines for convenience of explanation. When the tape is formed of a material having transparency, the patterns of the X coil and the Y coil may be visible.

Here, as illustrated in FIG. 7 and FIG. 8, in the second embodiment, the tape is wound in a spiral manner along the circumferential direction of the bobbin. The degree of overlapping of tape wound in a spiral manner can be adjusted appropriately. Moreover, as described in FIG. 7 and FIG. 8, the tape is wound separately in the first fixing range and the second fixing range. That is, the tape wound in the first fixing range and the tape wound in the second fixing range are not a sequence of tape but separate tape. In other words, the tape is wound around in the unit of regions divided into two or more in the axis direction of the bobbin, in each of the conductive plates in the second embodiment.

As the tape, for example, tape having certain tensile strength and elasticity is used preferably in view of Lorentz force acting on each coil in imaging. It is possible to use tape formed of, for example, a material of poly-paraphenylene benzobisoxazole (known by the name of Zylon (registered trademark)). Moreover, it is possible to use tape formed of, for example, a material of poly-paraphenylene terephthalamide (known by the name of Kevlar (registered trademark)). The material of the tape is not limited to ones described above.

Figure 9:
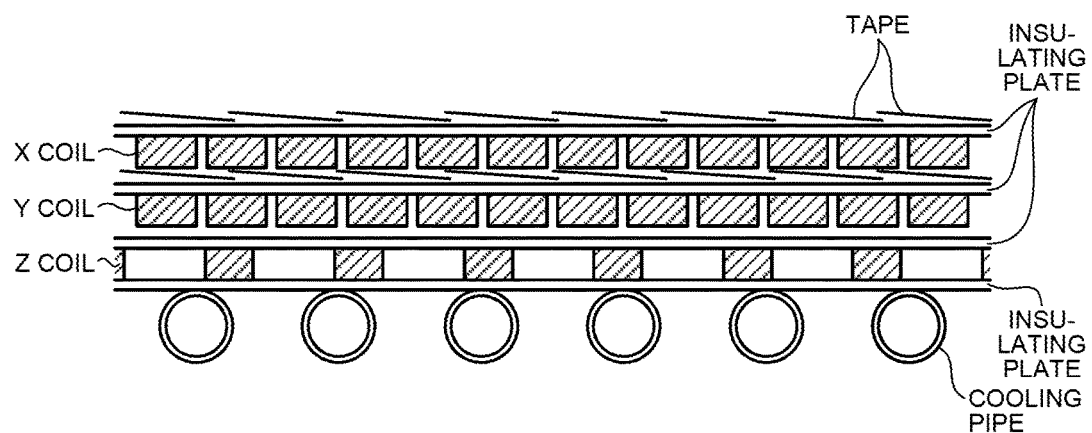
FIG. 9 is a diagram illustrating a section of a gradient coil according to the second embodiment.

FIG. 9 is a diagram illustrating a section of the gradient coil 103 according to the second embodiment. For example, FIG. 9 illustrates a section of a part of the gradient coil 103 and a section on the side of the shield coil 103b. When the cooling pipe, the Z coil, the Y coil, and the X coil are laminated in the order from the lower side with insulating plates appropriately interposed therebetween, for example, the tape is wound on the outer side of each of the Y coil and the X coil, as illustrated in FIG. 9. Note that the winding of the tape is not limited to the example illustrated in FIG. 9. For example, the laminating order of the coils can be changed appropriately. The relation between the pattern width of the coil and the tape width can be also changed appropriately. Moreover, the degree of overlapping of the tape can be changed appropriately. In addition, FIG. 9 illustrates the example in which the tape is wound around both the Y coil and the X coil. However, the embodiment is not limited thereto. For example, the tape may be wound around only one of them. Alternatively, the tape may be further wound around the Z coil.

In this manner, in the second embodiment, the tape is wound around the X coil and the Y coil in a spiral manner along the circumferential direction, which appropriately suppresses the situation in which each coil is moved by influence of Lorentz force generated in imaging. Moreover, in the second embodiment, the material is left also at parts where a spiral pattern is not formed, as described in the first embodiment. Thus, the fastening force by the tape is appropriately transmitted to lower layers, allowing appropriate fixing. For example, in fixing using the tape, it is possible to avoid the case in which the surface pressure of the tape damages insulating plates. In particular, Lorentz force generated at both end portions of the cylinder of the gradient coil 103 tends to be large. However, the material is left with the second pattern in both end portions, and the tape is wound on the second pattern, thus allowing appropriate fixing using the tape.

Modification of Second Embodiment

Figure 10:
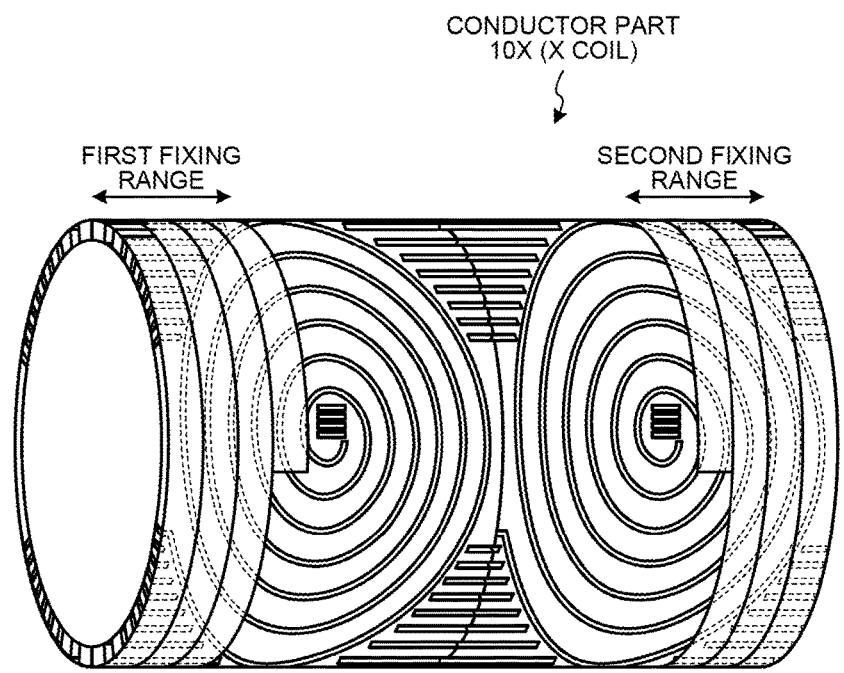
FIG. 10 is a diagram illustrating fixing of an X coil using tape according to a modification of the second embodiment.
Figure 11:
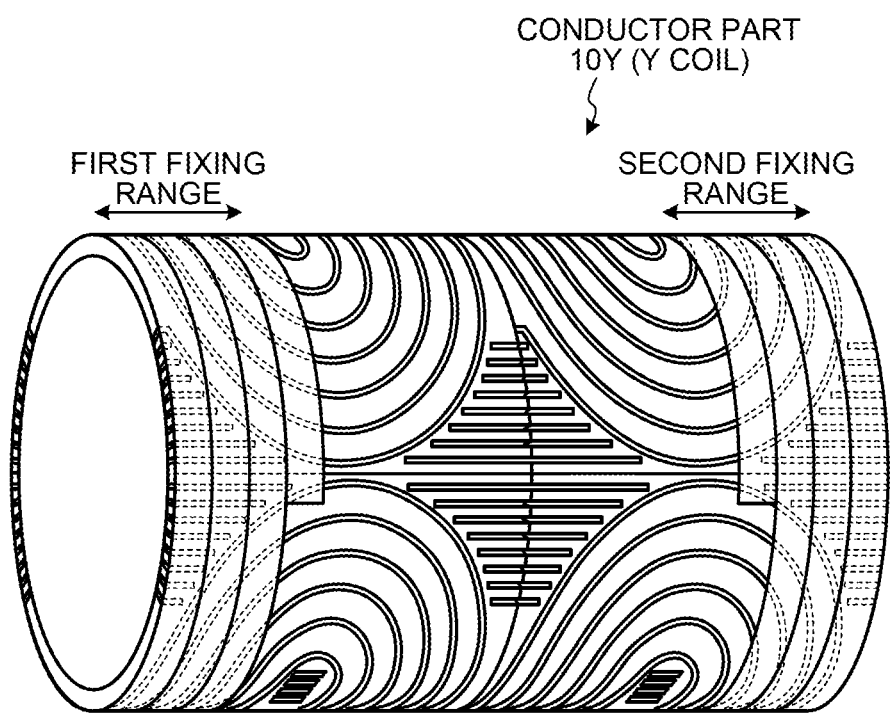
FIG. 11 is a diagram illustrating fixing of a Y coil using tape according to the modification of the second embodiment.

FIG. 10 is a diagram illustrating fixing of the X coil using tape according to a modification of the second embodiment, and FIG. 11 is a diagram illustrating fixing of the Y coil using tape according to the modification of the second embodiment. FIG. 7 and FIG. 8 illustrate the example in which the tape is wound around the entire conductive plate. However, the embodiment is not limited thereto. For example, the tape may be wound around only both end portions of the cylinder of the gradient coil 103, as illustrated in FIG. 10 and FIG. 11. The winding width and the like can be also changed appropriately.

Other Embodiment

The embodiment is not limited to ones described above.

Second Pattern

In the embodiments described above, the second pattern is a pattern of stripes substantially parallel to the axis direction of the cylindrical shape of the gradient coil 103. However, the embodiment is not limited thereto. The second pattern may be another pattern as long as it appropriately reduces an amount of impregnated resin and appropriately suppresses occurrence of an eddy current. For example, the second pattern may not be necessarily "stripes" formed by straight lines, and may be a pattern including curved lines. Moreover, the second pattern is not limited to one type, and may be the combination of a plurality of types.

Moreover, the embodiments described above assume the X coil and the Y coil formed by processing conductive plates. However, the embodiment is not limited thereto. The first pattern on the X coil and the Y coil may be formed by winding conductive wire in a spiral manner. In this case, the second pattern is formed so as to fill vacant space of the first pattern, using conductive or non-conductive wire.

Moreover, the embodiments described above assume an actively shielded gradient coil (ASGC) as the gradient coil 103. However, the embodiment is not limited thereto. In addition, the embodiments described above explain the example in which the X coil or the Y coil that is a saddle coil is formed using four conductive plates. However, the embodiment is not limited thereto. For example, the number and the arrangement method of the conductive plates can be changed appropriately.

Shape of Cylinder

In addition, the embodiments described above explain the case in which the static magnetic field magnet 101, the gradient coil 103, the bore, and the like are formed to have a cylindrical shape. However, this is not limited to the case in which a section of the cylinder (section orthogonal to a center axis) is completely circular. For example, in the embodiment, the section of the cylinder may be elliptical. That is, the static magnetic field magnet 101, the gradient coil 103, the bore, and the like may be formed to have a "substantially cylindrical" shape. Note that the substantially cylindrical shape includes cases in which the section of the cylinder is completely circular and elliptical. Moreover, the elliptical shape indicates a shape in which the section of the cylinder is distorted in a range not reducing the functions of the MRI device 100 significantly and a distance between the center axis of the cylinder and the periphery thereof is uneven.

With at least one of the embodiments described above, it is possible to provide a high quality gradient coil and magnetic resonance imaging device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A gradient coil for a magnetic resonance imaging (MRI) system, said gradient coil comprising:
   a saddle-shaped conductor part that is formed of a conductive material to have a cylindrical shape,
   wherein the conductor part includes:
   a spiral shaped first pattern configured to generate a gradient magnetic field when electrical current from an MRI system gradient magnetic field power supply is conducted there-along, and
   a striped second pattern different from the first pattern, the second pattern being formed at a center part inside the first pattern or at outer peripheral corner parts outside the first pattern, the second pattern being configured to be decoupled from generating a gradient magnetic field component used in imaging and electrically disconnected from the first pattern conductor part while said electrical current is supplied to said first pattern conductor part.

2. The gradient coil according to claim 1, wherein the second pattern is formed of slits parallel to an axis direction of the cylindrical shape so as to reduce eddy currents, Lorentz forces and magnetic field components having adverse influence on imaging.

3. The gradient coil according to claim 1, wherein the conductor part is a conductive plate on which the first pattern and the second pattern are processed.

4. The gradient coil according to claim 1, wherein:
the conductor part first pattern and the conductor part second pattern are provided as each of an X coil and a Y coil, and the conductor part first and second patterns of the X coil and of Y coil are respectively laminated and formed to have the cylindrical shape, and resin is impregnated between gaps of the laminated conductor part first and second patterns of the X coil and first and second patterns of the Y coil.

5. The gradient coil according to claim 1, wherein at least part of an exterior of the cylindrically shaped conductor part is wound with tape in a spiral manner, tape windings being axially spaced along a circumferential direction.

6. The gradient coil according to claim 5, wherein the tape is separately wound around the conductor part in respectively corresponding plural regions obtained by dividing the cylindrical shape into two or more regions in the axis direction thereof.

7. The gradient coil according to claim 5, wherein
the conductor part is formed by a plurality of conductive plates arranged in the axis direction of the cylindrical shape, and
the tape is wound around each of the conductive plates.

8. The gradient coil according to claim 5, wherein the tape is wound on the first and second patterns of the conductor part.

9. A magnetic resonance imaging (MRI) device comprising:
a static magnetic field magnet configured to generate a static magnetic field; and
a gradient coil configured to generate a gradient magnetic field,
wherein
the gradient coil includes a saddle-shaped conductor part that is formed of a conductive material to have a cylindrical shape, and
the conductor part includes:
a spiral shaped first pattern configured to generate the gradient magnetic field when electrical current from an MRI system gradient magnetic field power supply is conducted there-along, and
a striped second pattern different from the first pattern, the second pattern being formed at a center part inside the first pattern or at outer peripheral corner parts outside the first pattern, the second pattern being configured to be decoupled from generating a gradient magnetic field component used in imaging and electrically disconnected from the first pattern conductor part while said electrical current is supplied to said first pattern conductor part.

* * * * *